(12) United States Patent
Scalia et al.

(10) Patent No.: US 6,521,153 B1
(45) Date of Patent: Feb. 18, 2003

(54) METHOD FOR IN-SITU GREEN SHEET SLITTING

(75) Inventors: Lorenzo Scalia, Hopewell Junction, NY (US); Barry Donald Sewing, Beacon, NY (US)

(73) Assignee: International Business Machines Corporation, Armonk, NY (US)

(*) Notice: Subject to any disclaimer, the term of this patent is extended or adjusted under 35 U.S.C. 154(b) by 1218 days.

(21) Appl. No.: 08/928,902

(22) Filed: Sep. 12, 1997

Related U.S. Application Data

(62) Division of application No. 08/633,611, filed on Apr. 17, 1996, now Pat. No. 5,795,520, which is a continuation of application No. 08/298,480, filed on Aug. 29, 1994, now abandoned.

(51) Int. Cl.[7] ................................................ B28B 11/16
(52) U.S. Cl. ............................ 264/146; 83/13; 83/879; 83/880; 83/881; 83/884; 83/885
(58) Field of Search ................................ 264/650, 669, 264/678, 146; 83/13, 879, 880, 881, 884, 885

(56) References Cited

U.S. PATENT DOCUMENTS

| 235,263 | A |   | 12/1880 | Marshall |
|---|---|---|---|---|
| 658,025 | A |   | 12/1900 | Smith |
| 1,998,357 | A | * | 4/1935 | Carlson |
| 2,774,425 | A |   | 12/1956 | Hornstein et al. |
| 3,882,059 | A | * | 5/1975 | Elderbaum ............. 29/25.42 |
| 4,570,518 | A |   | 2/1986 | Bermeister |
| 5,015,430 | A | * | 5/1991 | Suzuki et al. ............ 264/146 |
| 5,051,219 | A |   | 9/1991 | Miller |

FOREIGN PATENT DOCUMENTS

| JP | 1-239909 | 9/1989 |
|---|---|---|
| JP | 2-62202 | 3/1990 |
| JP | 3-106605 | 5/1991 |
| JP | 3-187709 | 8/1991 |

* cited by examiner

Primary Examiner—Christopher A. Fiorilla
(74) Attorney, Agent, or Firm—Margaret A. Pepper

(57) ABSTRACT

The present invention relates generally to a new apparatus and method for in-situ green sheet slitting. More particularly, the invention encompasses an apparatus and method that uses a modified green sheet slitting machine so that it can provide an in-situ slitting of green sheets that result in a plurality of separate green sheets rolls or strips.

17 Claims, 2 Drawing Sheets

METHOD FOR IN-SITU GREEN SHEET SLITTING

CROSS-REFERENCE TO RELATED PATENT APPLICATIONS

This Patent Application is a Divisional of U.S. patent application Ser. No. 08/633,611, filed on Apr. 17, 1996, which issued as U.S. Pat. No. 5,795,520, on Aug. 18, 1998, and which was a Continuation of U.S. patent application Ser. No. 08/298,480, filed on Aug. 29, 1994, now abandoned.

FIELD OF THE INVENTION

The present invention relates generally to a new apparatus and method for in-situ green sheet slitting. More particularly, the invention encompasses an apparatus and method that uses a modified green sheet slitting machine so that it can provide an in-situ slitting of green sheets that result in a plurality of separate green sheets rolls or strips.

The invention is directed more to the slitting or indenting of the ceramic green sheet to any desired dimensions without the need of costly special tooling. The invention also solves the problem of building customized doctor blades to precise specifications and design. The inventive mechanism slits the green sheet tape by indenting the uncured ceramic tape with specially designed wheels. The invention uses the wheel's "toe-in" effect to part the uncured tape to its desired size. The slitting mechanism itself is located inside the curing oven and the slitting or indenting of the ceramic green sheet is done during the curing process and not after the curing process.

BACKGROUND OF THE INVENTION

Ceramic substrates for electronic applications are becoming more dense with the evolution of new technology. However, increases in circuit density produce a corresponding increase in overall manufacturing problems. Ceramic substrates manufacturers are therefore constantly challenged to improve the quality of their products by identifying and eliminating problems which produce defective parts. Whereas significant improvements are being made to eliminate systematic defects by reducing process variability. Process improvements alone are not sufficient to eliminate all the random defects which effect both yield and reliability. Historically, screening techniques have been employed to improve product failure rates to acceptable levels by culling out many of these random defects.

Normally, these ceramic substrates are made by using casting slurry or ceramic slip of material contained in a hopper. The slip material is typically a mixture of ceramic powder, organic binder and solvents. The ceramic tape or the green sheet is formed with the extrusion of a film of slurry on to a supporting or carrier strip or sheet, using a method known in the art as doctor blading. The ceramic slurry which is on the upper surface of the supporting strip is processed through a conventional belt type oven and the cured ceramic sheet along with the backing or carrier material is then spooled onto a spool. The conventional method of slitting the ceramic sheet is to cut through the cured ceramic tape forming individual blanks or green sheets. This conventional cutting process produces ceramic debris because this cutting is done to the solid cured ceramic sheet, which also creates contamination. The debris from the ceramic also creates other problems, such as, for example, defective parts, cleaning of the equipment, etc., and this of course adds cost to the process.

U.S. Pat. No. 1,998,357 (Carlson) discloses a web cutting and scoring device. A web of sheet material is brought in contact with a plurality of cutter knives and rotary scoring blades to create tracks, in order to either cut or score the web of sheet material into strips. A backing roller also helps provide the necessary pressure in the scoring or cutting operation of the web of sheet material.

U.S. Pat. No. 4,570,518 (Burmeister) discloses an apparatus for slitting of continuous webs into ribbons. The web material passes between a plurality of cutting blades and a backing roller and are cut into individual ribbons.

U.S. Pat. No. 5,051,219 (Miller) discloses an automatic handling of green ceramic tapes. A green ceramic tape on a supporting strip is rolled off a flanged roller. The supporting strip is then separated from the green ceramic tape and is wound-up on a spool for possible reuse, while the green ceramic tape is processed through a blanking press to form a plurality of blanking cards.

The above-mentioned problems of the prior art have been solved by the method and apparatus of this invention where the green sheet is unconventionally indented during the initial stages of the curing process and the curing process automatically divides the indented ceramic sheet into tapes or ribbons during the curing stage and these tapes or ribbons are free of any cutting contamination.

PURPOSES AND SUMMARY OF THE INVENTION

The invention is a novel method and an apparatus for in-situ green sheet slitting.

Therefore, one purpose of this invention is to provide an apparatus and a method that will provide an in-situ green sheet slitting.

Another purpose of this invention is to provide for a cutting wheel that will slit the green sheet without cutting or puncturing or penetrating the carrier or supporting sheet.

Still another purpose of this invention is to have a wheel that is toed-in at an angle to preclude the possible fusion of the ceramic tape or material.

Yet another purpose of this invention is to provide an indenting apparatus that can be located inside an oven or a heating chamber.

Still yet another purpose of the invention is to provide a ceramic tape or spool that is free from cutting debris.

Yet another purpose of this invention is to provide an indenting apparatus that will indent a continuous green sheet material inside an oven.

Therefore, in one aspect this invention comprises an apparatus for slitting ceramic green sheets comprising, (a) a slitting mechanism having at least one slitting wheel,
(b) moving means for bringing at least one layer of ceramic green sheet underneath said at least one slitting wheel, and wherein at least a portion of said at least one layer of ceramic green sheet is slit by said at least one slitting wheel.

In another aspect this invention comprises a method for slitting ceramic green sheets comprising, (a) a slitting mechanism having at least one slitting wheel,
(b) wherein at least one layer of ceramic green sheet is brought underneath said at least one slitting wheel, and wherein at least a portion of said at least one layer of ceramic green sheet is slit by said at least one slitting wheel.

In yet another aspect this invention comprises a method for slitting ceramic green sheets comprising, (a) contacting at least one green sheet with at least one slitting wheel prior to the time said green sheet has been cured, and (b) fully curing said green sheet, and wherein said slit widens and causes a separation in said green sheet.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 1A, is a side view, FIG. 1B, is a top view and FIG. 1C, is an end view of the preferred embodiment of the invention.

DETAILED DESCRIPTION OF THE INVENTION

The present invention is primarily directed to the slitting of ceramic tape or green sheet. The term "green" as used in the ceramics art refers to unfired ceramic bodies. Basically, the ceramic tape is normally cast from a slurry or a ceramic slip of material contained in a hopper. The slip material is typically a mixture of ceramic powder, organic binder and solvents. The ceramic tape or the green sheet is formed with the extrusion of a film of slurry onto a supporting strip, a method known in the art as doctor blading. The ceramic slurry on the upper surface of the supporting strip is processed through a conventional belt type oven and the cured ceramic sheet along with the backing material or the supporting strip is then spooled onto a spool. The conventional method of slitting the ceramic sheet is to cut through the cured ceramic tape after it has been processed and cured. As stated earlier this conventional cutting process produces ceramic debris thus creating contamination. The debris from the ceramic also creates problems, such as, for example, defective parts, cleaning of the equipment, etc., and this of course adds cost to the process. However, these and other problems of the prior art have been solved by the method and apparatus of this invention where the green sheet is unconventionally indented during the initial stages of the curing process and the curing process automatically divides the indented ceramic sheet into tapes or ribbons during the curing stage and these tapes or ribbons are free of any cutting contamination. Of course these tapes or ribbons can be cut to any desired size or width or shapes.

Figure 1A:
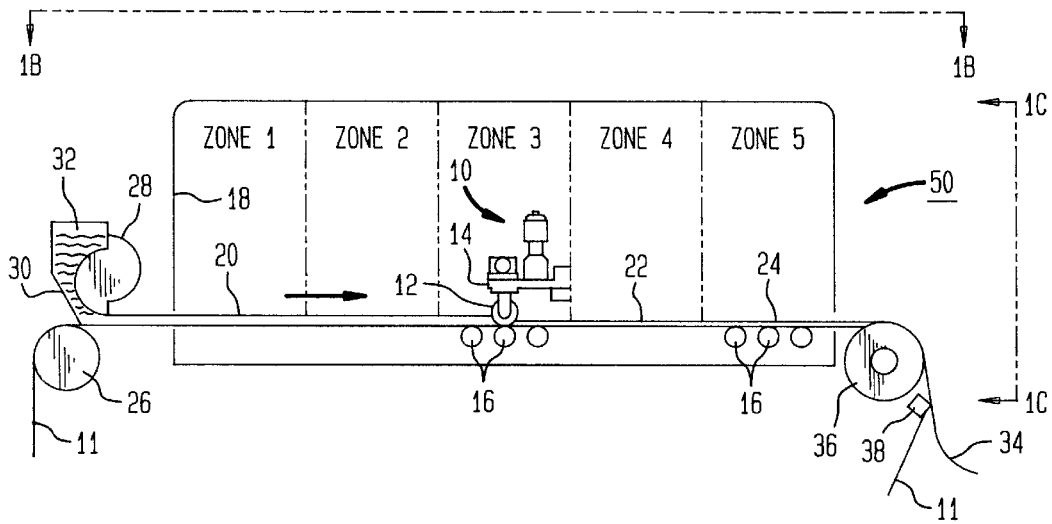
FIGS. 1A, 1B and 1C, illustrate a preferred embodiment of this invention, where
Figure 1B:
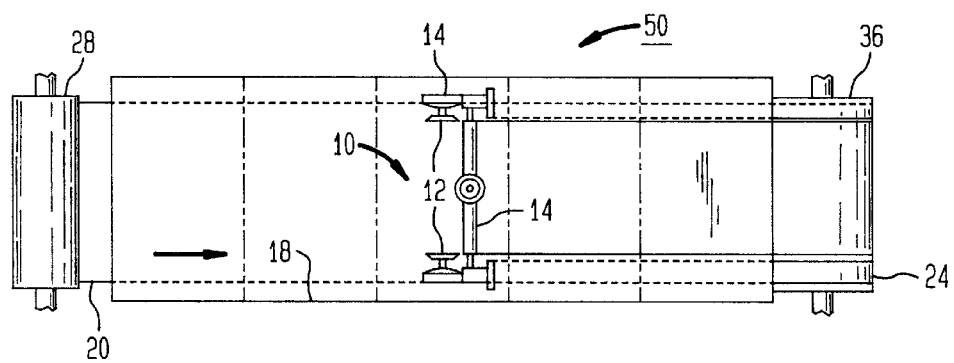
Figure 1C:
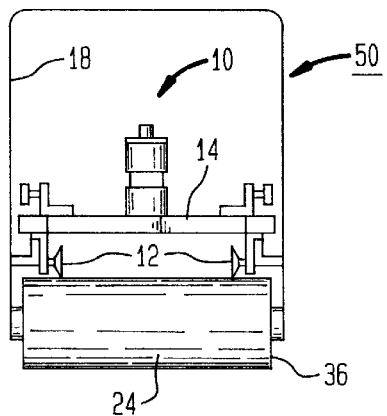

FIGS. 1A, 1B and 1C, illustrate a preferred embodiment of this invention, where FIG. 1A, is a side view, FIG. 1B, is a top view and FIG. 1C, is an end view of the preferred embodiment of the invention. The apparatus shown in FIGS. 1A, is referred to as a caster or casting machine 50, where "green sheet" ceramic is produced.

The caster machine 50, typically has multiple heating zones called ovens. Shown here are 5 heating zones or ovens which are marked as Zone 1, 2, 3, 4 and 5. At each end of the caster machine 50, there is a spooling mechanism for the unwinding and take-up of a supporting sheet or carrier or strip 11. As clearly shown in FIGS. 1A and 1B, a spooling mechanism 26, provides the supporting sheet 11, while spooling mechanism 36, could be used as the take-up spool.

Slurry 32, such as a ceramic slurry 32, which is contained in a hopper 30, is forced onto the supporting strip 11, using a doctor blade 28. The ceramic slurry 32, is basically allowed to exit through an opening between the hopper 30, and the supporting strip 11, thus depositing a continuous ceramic layer or material or film or green sheet material or uncured green ceramic material or film or ceramic material continuous sheet or film 20, having a thickness and a dough-like consistency onto the supporting strip 11, which carries it through the ovens zones for curing. The supporting strip or material 11, could be selected from material, such as, for example, Mylar, polyethylene or polyethylene teraphthalate.

The film of dough-like uncured ceramic layer or film 20, lays on the surface of the supporting strip 11, as it progresses through the initial curing zones. The slitting or indenting mechanism 10, is arbitrarily positioned in one of the zones, but, it is generally understood that depending on the characteristics of the process parameters, such as, for example, temperature, speed, air flows, material density, thickness, and other variables, different zones may be used.

As shown in FIGS. 1B and 1C, the main frame or housing 14, of the slitting or indenting mechanism 10, is secured or anchored to a frame or housing 18, of the casting machine 50. This is done in such a way that the indenting wheels or slitting wheels 12, are directly positioned in line with the back up rollers 16. The indenting or scoring wheels 12, are analogous to pizza roller cutters. The indenting wheels 12, are typically located near a point when the green sheet material 20, has partly dried or cured but before it enters the curing ovens. The indenting or cutting motion is imparted onto the uncured green ceramic material or film 20, when the ceramic material continuous sheet or film 20, passes between the indenting wheels 12, and the back-up rollers 16. Care should be taken that the indenting wheel 12, indents the green sheet material 20, only and does not penetrate or puncture the carrier 11. Furthermore, the back-up rollers 16, should be there mostly to provide support to the carrier 11, and the uncured green ceramic material or film 20, and to provide the bare minimum pressure onto the cutting blades or wheels 12, during the indenting or scoring process.

After the uncured green ceramic film or sheet 20, has passed through the indenting blades 12, it then is almost in a semi-cured form and henceforth will be referred to as the semi-cured green ceramic sheet 22. The semi-cured ceramic green sheet 22, progresses through the various other curing and/or heating zones and finally the stripping bar 38, separates the supporting strip 11, from the fully cured ceramic green sheet 24, to form individual ceramic green sheet strips or ribbons 34.

FIG. 1C, shows the slitting mechanism 10, as viewed from the front where the scoring or indenting wheels 12, could be moved at any point across the green sheet to indent or score the green sheet 22. For the purposes of illustration only two slitting or indenting wheels 12, are shown, however, it is to be understood that the housing 14, could have a plurality of indenting or cutting wheels 12.

Figure 2:
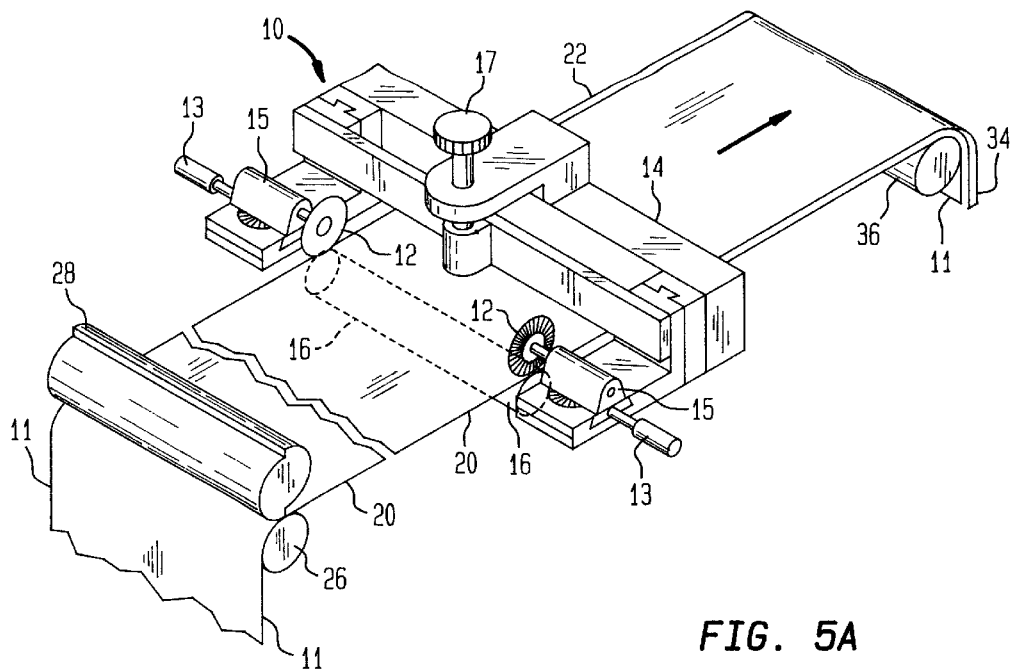
FIG. 2, illustrates a more detailed and a perspective view of the preferred embodiment of the slitting or indenting or scoring mechanism of this invention.

FIG. 2, illustrates a more detailed and a perspective view of the preferred embodiment of the slitting or indenting or scoring mechanism 10, of this invention. Shown in more detail are some of the critical components of the slitting mechanism 10, such as, for example, a means 13, for adjusting the cutting or indenting width of the cutting or indenting blade 12, a means 17, for height or depth adjustments of the scoring blade 12, and a means 15, for rotational toe-in adjustment of the indenting wheel 12. Means 13, 15 and 17, all could be for example a micrometer, but other similar instruments well known in the art for such purposes could also be used. The indenting mechanism 10, that is normally mounted on precision slides and precision bearing pillow blocks is typically secured to the inside walls of the caster ovens' main frame.

Figure 3:
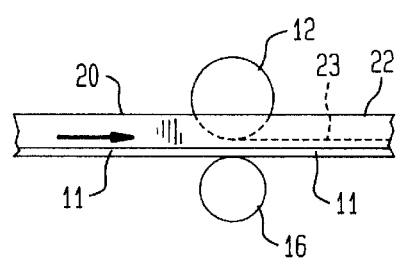
FIG. 3, illustrates the indentation of a ceramic green sheet using the preferred embodiment of this invention.

FIG. 3, illustrates the process of the indentation of a ceramic green sheet using the preferred embodiment of this invention. Dough-like or semi-solid green ceramic material or film 20, on the supporting sheet 11, comes in contact with the scoring or indenting wheel 12. For most applications the indenting wheel 12, makes a small mark or notch or indentation 23, on the uncured green ceramic material 20, creating indented semi-cured green sheet 22. The depth of the indentation or mark 23, will vary from material to material and from application to application. For some applications a small indentation would be sufficient to cause the formation of the individual ceramic green sheets or strips. While for others, the cutting blade 12, may have to penetrate the whole or substantial depth of the material 20, to cause the formation of the individual ribbons 62, 64, 66 and 68, as shown and discussed in more detail in FIG. 4D. Preferably, a back-up roller 16, is provided to assist in the indenting or scoring or slitting process.

Figure 4A:
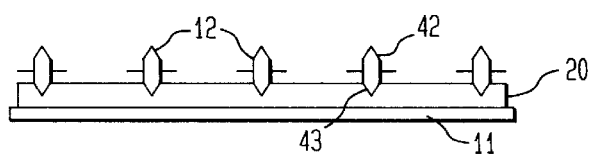
FIGS. 4A, 4B, 4C and 4D, provide a more detailed view of the process of indenting and separating the green sheet material using the preferred embodiment of this invention.

FIGS. 4A, 4B, 4C and 4D, provide a more detailed view of the process of indenting and separating the green sheet material using the preferred embodiment of this invention. As shown in FIG. 4A, scoring wheels 12, having a double-sided indenting or scoring blade 42, first -contacts with the uncured or dough-like ceramic green sheet material 20, to preferably form a mark or an indentation 43.

Figure 4B:
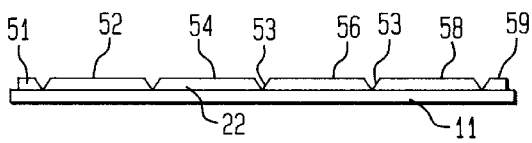

It has been found that when the uncured ceramic material or film 20, as can be clearly seen in FIG. 4B, is processed through the various heating or curing zones of the oven a portion of it will shrink due to the evaporation of the solvents and other materials creating a widening of the indented area and further forming a semi-cured ceramic green sheet 22, having a wider indentation 53. This also creates semi-individual ribbons or strips 52, 54, 56 and 58, of ceramic green sheet material. The ceramic edge material 51 and 59, can normally be discarded as scrap material.

Figure 4C:
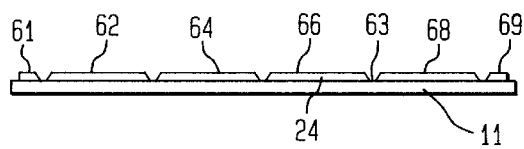

FIG. 4C, shows that the semi-individual ribbons or strips 52, 54, 56 and 58, of FIG. 4B, have now become independent individual ribbons or strips 62, 64, 66 and 68, respectively, of fully cured ceramic green sheet material. Furthermore, indented area 53, widens completely to form indented area 63. At indented area 63, the upper surface of the supporting sheet 11, is exposed. Fully cured edge material 61 and 69, is typically removed by methods well known in the art as scrap material.

Figure 4D:
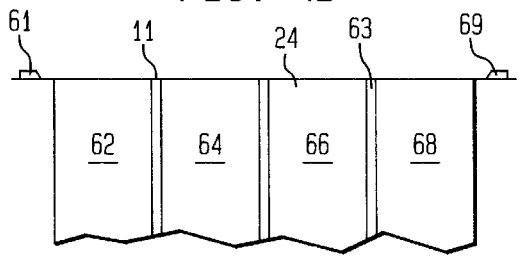

The top view of the separated individual ribbons or strips 62, 64, 66 and 68, of the fully cured ceramic green sheet is shown in FIG. 4D. As can be clearly seen that the individual strips 62, 64, 66 and 68, are formed in situ and there is no debris as a result of forming the separate ceramic green sheets. The debris, if any, would stick to the supporting strip 11, and would fall off when the individual strips of green ceramic sheet 62, 64, 66 and 68, are separated from the supporting strip 11.

Figure 5A:
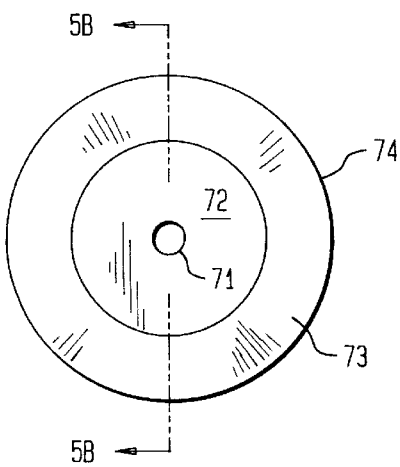
FIGS. 5A and 5B, illustrate another embodiment of a cutter blade used in this invention.
Figure 5B:
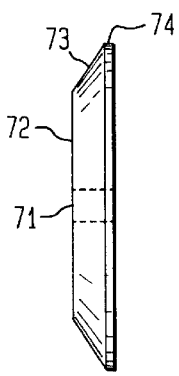

FIGS. 5A and 5B, illustrate another embodiment of a cutter or indenting or scoring blade 72, used in this invention. The blade 72, has an indenting flat-point 74, and typically a smooth tapered or a sharp cutting surface 73. A hole or opening 71, allows the blade 72, to ride on a spindle or similar such device while in the cutting or indenting mode. The indenting flat point 74, typically is between about 0.002 inch and about 0.020 inch, depending on the thickness of the material that will be indented or cut with the scoring blade 72.

As stated earlier that the variable positioned indenting wheels 12, for the slitting of the uncured ceramic green sheet or film 20, should be position at a depth that cuts or indents the ceramic green film or sheet 20, without cutting or damaging the carrier or supporting sheet 11. One way of doing this would be to fabricate the indenting wheels 12, with a flat edge 74, at the indenting or scoring point to preclude the cutting or penetrating of the polymer-type carrier 11. The thickness or width of the flat edge 74, would of course depend upon the material and dimensions of the slitting wheel 12, however, for most ceramic materials a flat edge of between about 0.002 inch and about 0.020 inch would be acceptable.

It has been found that the indenting wheels 12, should be toed-in at an angle to preclude the subsequent fusion of the ceramic green tape or strip. This toe-in angle that is needed will depend directly on the density of the ceramic green sheet material.

The location of the indenting or scoring mechanism 10, depend on the density and other material properties of the ceramic material 32. Therefore, the slitting mechanism 10, along with the indenting wheels 12, could be located inside any of the heating chamber's zone 1, zone 2, zone 3, zone 4, etc. This location of course will be predetermined by the density and setting of the liquid ceramic mixture. It is very important that the cutting or scoring of the ceramic material is done during the curing process and not after the curing process. If, for example, the indenting or cutting mechanism 10, is placed towards the end of the curing cycle then it is possible that the ceramic green sheet has been fully cured and is now a solid and thus if any indentation or slitting takes place then that cutting or indentation will most probably result in contamination debris.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope -and spirit of the present invention.

What is claimed is:

1. A method for slitting at least one layer of ceramic green sheet comprising,
    (a) an apparatus used to practice the method comprising a slitting mechanism having at least one slitting wheel inside at least one heating zone,
    (b) bringing at least one layer of ceramic green sheet underneath said at least one slitting wheel inside said at least one heating zone, and
    (c) slitting at least a portion of said at least one layer of ceramic green sheet by said at least one slitting wheel while being heated inside said at least one heating zone.

2. The method of claim 1, wherein material for said ceramic green sheet is selected from the group consisting of uncured ceramic material, semi-cured ceramic material and cured ceramic material.

3. The method of claim 1, wherein said at least one slitting wheel has an outer peripheral edge and wherein at least a portion of said peripheral edge has a flat surface.

4. The method of claim 1, wherein said slitting mechanism has at least one means to adjust the depth of said slit by said at least one slitting wheel.

5. The method of claim 1, wherein said at least one slitting wheel has a toe and wherein said slitting mechanism has at least one means to adjust said toe of said at least one slitting wheel.

6. The method of claim 1, wherein said slitting mechanism is inside an oven and secured thereto.

7. The method of claim 1, wherein said at least one layer of ceramic green sheet is on a carrier.

8. The method of claim 7, wherein material for said carrier is selected from the group consisting of polyethylene and polyethylene teraphthalate material.

9. A method for slitting at least one green sheet comprising,
   (a) contacting at least one uncured green sheet with at least one slitting wheel inside at least one heating zone,
   (b) forming at least one slit in said at least one uncured green sheet while being heated inside said at least one heating zone, and
   (c) fully curing said at least one uncured green sheet to form at least one cured green sheet.

10. The method of claim 9, wherein material for said at least one green sheet is selected from the group consisting of uncured ceramic material and semi-cured ceramic material.

11. The method of claim 9, wherein said at least one slitting wheel has an outer peripheral edge and wherein at least a portion of said peripheral edge has a flat surface.

12. The method of claim 9, wherein the depth of said slit by said at least one slitting wheel is adjustable.

13. The method of claim 9, wherein said at least one slitting wheel has a toe and wherein said toe of said at least one slitting wheel is adjustable.

14. The method of claim 9, wherein at least one of said at least one slitting wheel is inside an oven and secure thereto.

15. The method of claim 9, wherein said at least one green sheet is on a carrier.

16. The method of claim 15, wherein material for said carrier is selected from the group consisting of polyethylene and polyethylene teraphthalate material.

17. The method of claim 9, wherein in step (c) upon fully curing said at least one uncured green sheet said slit widens and causes a separation in said cured green sheet.

* * * * *